United States Patent
Chun et al.

(10) Patent No.: US 10,930,797 B2
(45) Date of Patent: Feb. 23, 2021

(54) SCHOTTKY BARRIER DIODE AND METHOD OF MANUFACTURING THE SAME

(71) Applicant: HYUNDAI MOTOR COMPANY, Seoul (KR)

(72) Inventors: Dae Hwan Chun, Gwangmyeong-si (KR); Youngkyun Jung, Seoul (KR); Nack Yong Joo, Hanam-si (KR); Junghee Park, Suwon-si (KR); Jong Seok Lee, Suwon-si (KR)

(73) Assignee: HYUNDAI MOTOR COMPANY, LTD., Seoul (KR)

( * ) Notice: Subject to any disclaimer, the term of this patent is extended or adjusted under 35 U.S.C. 154(b) by 0 days.

(21) Appl. No.: 15/374,468

(22) Filed: Dec. 9, 2016

(65) Prior Publication Data

US 2018/0013014 A1 Jan. 11, 2018

(30) Foreign Application Priority Data

Jul. 5, 2016 (KR) .................. 10-2016-0084839

(51) Int. Cl.
*H01L 29/872* (2006.01)
*H01L 29/06* (2006.01)
(Continued)

(52) U.S. Cl.
CPC .......... *H01L 29/872* (2013.01); *H01L 21/046* (2013.01); *H01L 29/0619* (2013.01);
(Continued)

(58) Field of Classification Search
CPC .................. H01L 29/872; H01L 29/0688; H01L 29/1608
(Continued)

(56) References Cited

U.S. PATENT DOCUMENTS 8,227,811 B2 7/2012 Mizukami et al.
8,937,319 B2 * 1/2015 Maeyama ........... H01L 29/0619
257/472
(Continued)

FOREIGN PATENT DOCUMENTS

CN 103443907 A 12/2013
CN 103887346 A 6/2014
(Continued)

OTHER PUBLICATIONS

Chien et al., "A Novel High Channel Density Trench Power MOSFETs Design by Asymmetric Wing-cell Structure."
(Continued)

*Primary Examiner* — Robert T Huber
(74) *Attorney, Agent, or Firm* — Morgan, Lewis & Bockius LLP

(57) ABSTRACT

A Schottky barrier diode includes: an n− type layer disposed on a first surface of an n+ type silicon carbide substrate; a p+ type region and a p type region disposed on the n− type layer and separated from each other; an anode disposed on the n− type layer, the p+ type region, and the p type region; and a cathode disposed on a second surface of the n+ type silicon carbide substrate. The p type region is in plural, has a hexagonal shape on the plane, and is arranged in a matrix shape, and the n− type layer disposed between the p+ type region and the p type region has a hexagonal shape on the plane and encloses the p type region.

10 Claims, 8 Drawing Sheets

(51) Int. Cl.
  *H01L 29/16* (2006.01)
  *H01L 21/04* (2006.01)
  *H01L 29/08* (2006.01)
  *H01L 29/66* (2006.01)

(52) U.S. Cl.
  CPC ...... *H01L 29/0688* (2013.01); *H01L 29/0692* (2013.01); *H01L 29/0696* (2013.01); *H01L 29/08* (2013.01); *H01L 29/1608* (2013.01); *H01L 29/6606* (2013.01)

(58) Field of Classification Search
  USPC .................................. 257/77, 471, E29.338
  See application file for complete search history.

(56) References Cited

U.S. PATENT DOCUMENTS

| | | | | |
|---|---|---|---|---|
| 2011/0248285 A1* | 10/2011 | Zhang | ................... | H01L 21/046 257/77 |
| 2012/0056197 A1* | 3/2012 | Mizukami | ........... | H01L 29/1608 257/77 |
| 2012/0223332 A1* | 9/2012 | Kamaga | ................ | H01L 29/063 257/77 |
| 2015/0076515 A1* | 3/2015 | Jung | ................... | H01L 29/6606 257/77 |

FOREIGN PATENT DOCUMENTS

| | | |
|---|---|---|
| CN | 104465793 A | 3/2015 |
| JP | 2008-251925 A | 10/2008 |
| JP | 4764003 B2 | 8/2011 |
| JP | 2012-231019 A | 11/2012 |
| KR | 10-2013-0049916 A | 5/2013 |
| KR | 10-1518905 B1 | 5/2015 |
| KR | 10-2015-0078454 A | 7/2015 |

OTHER PUBLICATIONS

P. Alexandrov et al., "Demonstration of high voltage (600-1300 V), high current (10-140 A), fast recovery 4H-SiC p-i-n/ Schottky(MPS) barrier diodes," Solid-State Electronics, vol. 47, (2003) pp. 263-269.
Office Action issued in corresponding Chinese Patent Application No. 201611149881.9 dated Sep. 24, 2020, with English translation.

* cited by examiner

Prior Art

SCHOTTKY BARRIER DIODE AND METHOD OF MANUFACTURING THE SAME

CROSS-REFERENCE TO RELATED APPLICATION

This application claims the benefit of priority to Korean Patent Application No. 10-2016-0084839 filed in the Korean Intellectual Property Office on Jul. 5, 2016, the entire content of which is incorporated herein by reference.

TECHNICAL FIELD

The present disclosure relates to a Schottky barrier diode including silicon carbide (SiC), and a method of manufacturing the same.

BACKGROUND

A Schottky barrier diode (SBD) uses a Schottky junction in which a metal and a semiconductor are joined instead of a PN junction, unlike a general PN diode, exhibits a rapid switching characteristic, and has a lower turn-on voltage characteristic than that of the PN diode.

In a general Schottky barrier diode, a structure of a junction barrier Schottky (JBS) in which a p+ region is formed at a lower end of a Schottky junction portion, is applied in order to improve leakage current reduction, thereby obtaining an effect of blocking the leakage current and improving a breakdown voltage by overlapping of PN diode depletion layers that are diffused when a reverse voltage is applied.

A p+ type region and a p type region having different ion doping concentrations are formed to reduce an electric field of the Schottky junction region such that a leakage current may be reduced when applying a reverse voltage.

The above information disclosed in this Background section is only for enhancement of understanding of the background of the invention, and therefore, it may contain information that does not form the prior art that is already known in this country to a person of ordinary skill in the art.

SUMMARY

The present disclosure increases a current density of a Schottky barrier diode.

A Schottky barrier diode according to an exemplary embodiment of the present disclosure includes an n− type layer disposed on a first surface of an n+ type silicon carbide substrate; a p+ type region and a p type region disposed on the n− type layer and separated from each other; an anode disposed on the n− type layer, the p+ type region, and the p type region; and a cathode disposed on a second surface of the n+ type silicon carbide substrate, wherein the p type region is in plural, has a hexagonal shape on a plane, and is arranged in a matrix shape, and the n− type layer disposed between the p+ type region and the p type region has a hexagonal shape on the plane and encloses the p type region.

A horizontal line passing through a center point of the p type region does not meet a horizontal line of the p type region adjacent thereto in the column direction on the plane.

The p+ type region and the p type region may respectively contact the n− type layer, and an area where the p+ type region and the n− type layer contact may be wider than an area where the p type region and the n− type layer contact.

An ion doping concentration of the p+ type region may be higher than an ion doping concentration of the p type region.

The anode may include a Schottky electrode, and the cathode may include an ohmic electrode.

The Schottky barrier diode may further include an n type layer positioned between the anode and the n− type layer, and an ion doping concentration of the n type layer may be higher than an ion doping concentration of the n− type layer.

The Schottky barrier diode may further include a first trench and a second trench disposed on the n type layer and separated from each other.

The p+ type region may be disposed under a lower surface of the first trench, and the p type region may be disposed under a bottom surface of the second trench.

The anode may include a first anode disposed inside the first trench and the second trench, and a second anode disposed on the first anode and the n type layer.

A manufacturing method of a Schottky barrier diode according to another exemplary embodiment of the present disclosure includes sequentially forming an n− type layer and an n type layer at a first surface of a n+ type silicon carbide substrate; forming a first trench and a second trench separated from each other at the n type layer; injecting a p+ type ion to the lower surface of the first trench to form a p+ type region; injecting a p type ion to the lower surface of the second trench to form a p type region; forming an anode on the n type layer, inside the first trench, and inside the second trench; and forming a cathode at a second surface of the n+ type silicon carbide substrate, wherein the p type region is in plural, has a hexagonal shape on a plane, and is arranged in a matrix shape, and the n− type layer disposed between the p+ type region and the p type region has a hexagonal shape on a plane and encloses the p type region.

As described above, according to an exemplary embodiment of the present disclosure, by forming the contact area of the p+ type region and the n− type layer to be larger than the contact area of the p type region and the n− type layer, the current density of the Schottky barrier diode may be increased when applying a foreword voltage.

Accordingly, the area of the Schottky barrier diode may be decreased, thereby improving a number of Schottky barrier diodes per unit wafer and a yield thereof.

DETAILED DESCRIPTION OF THE EMBODIMENTS

Figure 1:
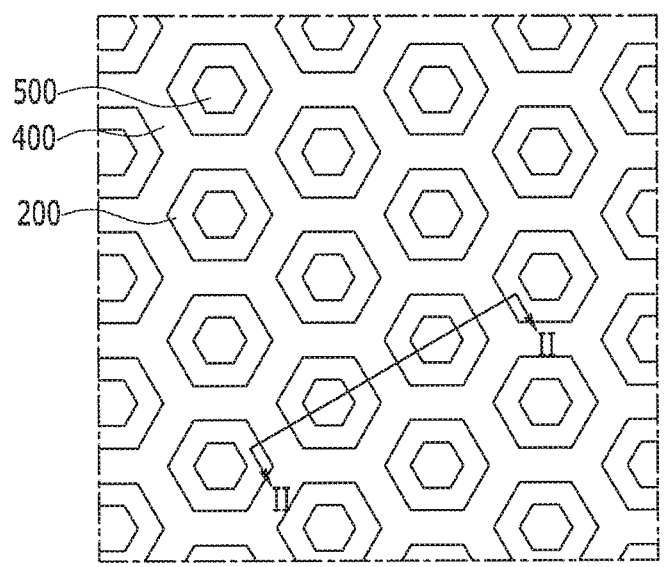
FIG. 1 is a layout showing one example of a Schottky barrier diode according to an exemplary embodiment of the present disclosure.

Exemplary embodiments of the present disclosure will be described in detail with reference to the accompanying drawings. As those skilled in the art would realize, the described embodiments may be modified in various different ways, all without departing from the spirit or scope of the present disclosure. The exemplary embodiments that are disclosed herein are provided so that the disclosed contents may become thorough and complete and the spirit of the present disclosure may be sufficiently understood by a person of ordinary skill in the art.

In the drawings, the thickness of layers and regions are exaggerated for clarity. In addition, when it is mentioned that a layer is present "on" the other layer or a substrate, the layer may be directly formed on another layer or the substrate or a third layer may be interposed therebetween. Like reference numerals designate like constituent elements throughout the specification.

Figure 2:
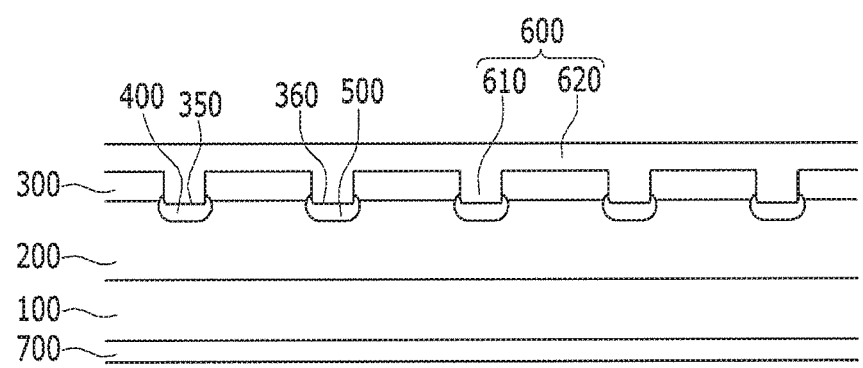
FIG. 2 is a cross-sectional view take along a line II-II of FIG. 1.

FIG. 1 is a layout showing one example of a Schottky barrier diode according to an exemplary embodiment of the present disclosure. FIG. 2 is a cross-sectional view take along a line II-II of FIG. 1.

As shown in FIG. 1 and FIG. 2, the Schottky barrier diode according to an exemplary embodiment includes an n+ type silicon carbide substrate 100, an n− type layer 200, an n type layer 300, a p+ type region 400, a p type region 500, an anode 600, and a cathode 700.

In the layout of FIG. 1, the n type layer 300 and the anode 600 are omitted. Referring to FIG. 1, on the plane, the p type region 500 is formed with a hexagonal shape and is separated from the p+ type region 400. The n− type layer 200 is positioned between the p type region 500 and the p+ type region 400. The n− type layer 200 positioned between the p type region 500 and the p+ type region 400 is formed with a hexagonal shape. That is, on the plane, the n− type layer 200 of the hexagonal shape encloses the p type region 500 with the hexagonal shape, and the p+ type region 400 is positioned at the remaining portion. Here, the n− type layer 200 and the p type region 500 positioned between the p type region 500 and the p+ type region 400 may have a regular hexagon shape on a plane.

The p type region 500 is in plural and is arranged in a matrix shape. The plurality of p type regions 500 are positioned in a zigzag shape in a column direction such that a horizontal line passing through a center point of the p type region 500 does not meet a horizontal line passing through the center point of the p type region 500 positioned to be adjacent thereto in the column direction on the plane.

Now, the detailed structure of the semiconductor device according to an exemplary embodiment of the present disclosure will be described.

The n− type layer 200 and the n type layer 300 are sequentially positioned at the first surface of the n+ type silicon carbide substrate 100. An ion doping concentration of the n type layer 300 may be higher than an ion doping concentration of the n− type layer 200.

The first trench 350 and the second trench 360 are formed in the n type layer 300, and the first trench 350 and the second trench 360 are adjacent to each other and are separated from each other. Depths of the first trench 350 and the second trench 360 may be the same.

The p+ type region 400 is positioned under a lower surface of the first trench 350, and the p type region 500 is positioned under the lower surface of the second trench 360. The ion doping concentration of the p+ type region 400 is higher than the ion doping concentration of the p type region 500.

The p+ type region 400 encloses a corner of the lower surface of the first trench 350 and contacts the n− type layer 200. The p type region 500 encloses the corner of the lower surface of the second trench 360 and contacts the n− type layer 200.

The anode 600 is positioned on the n type layer 300, inside the first trench 350, and inside the second trench 360. The anode 600 may include a Schottky metal. The anode 600 includes a first anode 610 positioned inside the first trench 350 and inside the second trench 360 and a second anode 620 positioned on the first anode 610 and the n type layer 300. The first anode 610 contacts the p+ type region 400 and the p type region 500.

The cathode 700 is positioned at the second surface of the n+ type silicon carbide substrate 100. The cathode 700 may include the ohmic metal. Here, the second surface of the n+ type silicon carbide substrate 100 is positioned at the side opposite to the first surface of the n+ type silicon carbide substrate 100.

Since the ion doping concentration of the p+ type region 400 is higher than the ion doping concentration of the p type region 500, when applying a foreword voltage, a hole current density in a portion where the p+ type region 400 and the n− type layer 200 are joined is higher than a hole current density in a portion where the p type region 500 and the n− type layer 200 are joined.

As described above, on the plane, the n− type layer 200 with the hexagonal shape encloses the p type region 500 with the hexagonal shape, the p+ type region 400 is positioned in the remaining portion, and the p+ type region 400 and the p type region 500 respectively contact the n− type layer 200. Accordingly, the area where the p+ type region 400 and the n− type layer 200 contact is wider than the area where the p type region 500 and the n− type layer 200 contact.

That is, the area where the p+ type region 400 and the n− type layer 200 contact is widened such that the hole current density of the Schottky barrier diode is increased, thereby increasing the entire current density of the Schottky barrier diode.

Due to the increasing of the current density of the Schottky barrier diode, the area of the Schottky barrier diode may be reduced such that the number of Schottky barrier diodes per unit wafer and the yield may be improved.

Next, a characteristic of the Schottky barrier diode according to an exemplary embodiment of the present disclosure will be described with reference to FIG. 3, FIG. 4, and Table 1.

Figure 3:
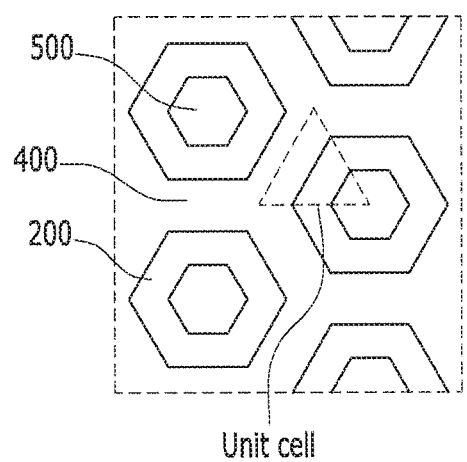
FIG. 3 is a layout view partially showing a Schottky barrier diode according to an exemplary embodiment of the present disclosure.
Figure 4:
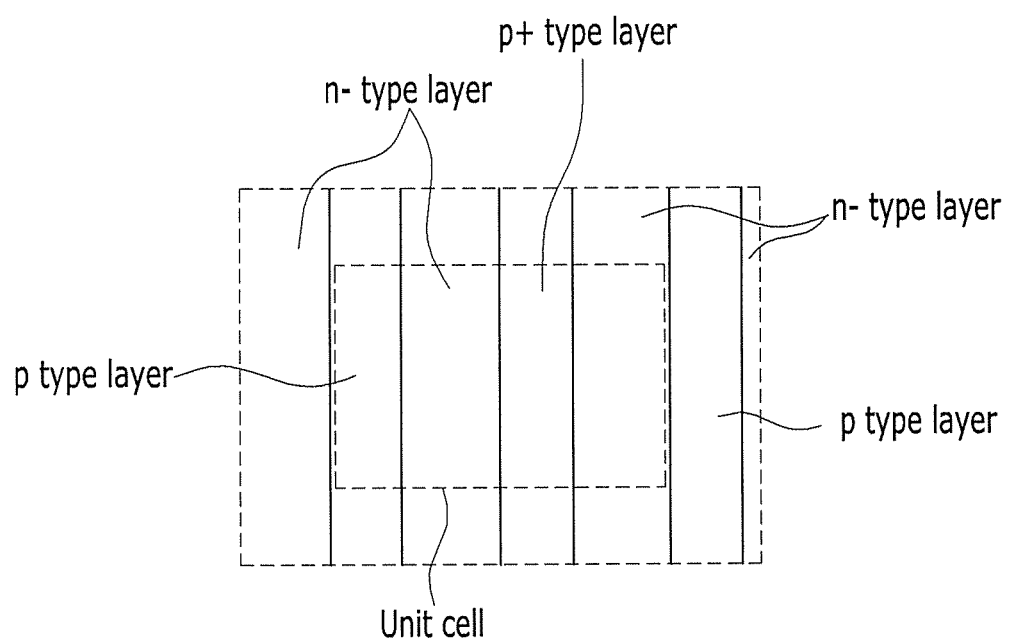
FIG. 4 is a layout view partially showing a Schottky barrier diode according to a comparative example.

As shown in FIG. 3 and FIG. 4, the Schottky barrier diode according to an exemplary embodiment of the present disclosure and the Schottky barrier diode according to a comparative example are prepared.

FIG. 3 is a layout view partially showing a Schottky barrier diode according to an exemplary embodiment of the present disclosure.

FIG. 4 is a layout view partially showing a Schottky barrier diode according to a comparative example.

Referring to FIG. 3, as described above, the Schottky barrier diode according to an exemplary embodiment of the present disclosure has a structure in which the n− type layer 200 of the hexagonal shape encloses the p type region 500 with the hexagonal shape and the p+ type region 400 is positioned in the remaining portion on the plane. Here, a triangle having lines respectively connecting the center of the p type region 500 and two adjacent vertices of the p type region 500 with the hexagonal shape and a line connecting center portions of two adjacent p type regions 500 as a side may be formed, and this triangle is referred to as a unit cell.

Referring to FIG. 4, the Schottky barrier diode according to a comparative example has a structure in which the p+ type region and the p type region are formed with a bar shape, and the n− type layer 200 is positioned between the p+ type region and the p type region. In this case, a quadrangle including one p type region and one p+ type region may be formed, and this quadrangle is referred to as a unit cell.

In the unit cell of the Schottky barrier diode according to an exemplary embodiment of the present disclosure, it may be confirmed that the area occupied by the p+ type region is wider than the area occupied by the p type region. In the unit cell of the Schottky barrier diode according to the comparative example, it may be confirmed that the area occupied by the p+ type region is the same as the area occupied by the p type region.

Table 1 represents a simulation result of the Schottky barrier diode according to an exemplary embodiment of the present disclosure and the Schottky barrier diode according to the comparative example when applying a foreword voltage.

TABLE 1

| Division | Electron current density per unit cell (A/μm²) | Hole current density per unit cell (A/μm²) | Entire current density per unit cell (A/cm²) | Conducting portion area (cm² @100 A) |
|---|---|---|---|---|
| Comparative Example | 124 | 162 | 286 | 0.350 |
| Exemplary Embodiment | 124 | 203 | 327 | 0.306 |

Referring to 1, it may be confirmed that the electron current density per unit cell of the Schottky barrier diode according to the present exemplary embodiment is the same as the electron current density per unit cell of the Schottky barrier diode according to the comparative example, however, the hole current density per unit cell of the Schottky barrier diode according to the present exemplary embodiment is increased compared with the hole current density per unit cell of the Schottky barrier diode according to the comparative example by about 25%. Accordingly, it may be confirmed that the entire current density per unit cell of the Schottky barrier diode according to the present exemplary embodiment is increased compared with the entire current density per unit cell of the Schottky barrier diode according to the comparative example by about 14%.

Based on the same current amount of 100 A, it may be confirmed that the area of the Schottky barrier diode according to the present exemplary embodiment is decreased compared with the area of the Schottky barrier diode according to the comparative example by about 13%. Therefore, a greater number of Schottky barrier diodes according to the present exemplary embodiment may be included per unit wafer compared with the Schottky barrier diodes according to the comparative example, thereby reducing the cost.

Next, a manufacturing method of a semiconductor element according to an exemplary embodiment of the present disclosure will be described with reference to FIG. 5 to FIG. 8.

FIG. 5 to FIG. 8 are views showing one example of a manufacturing method of a Schottky barrier diode according to an exemplary embodiment of the present disclosure.

Figure 5:
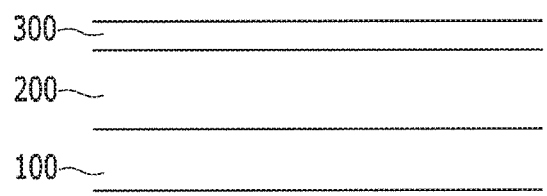
FIG. 5 to FIG. 8 are views showing one example of a manufacturing method of a Schottky barrier diode according to an exemplary embodiment of the present disclosure.

Referring to FIG. 5, an n+ type silicon carbide substrate 100 is prepared, and an n− type layer 200 and an n type layer 300 are sequentially formed at a first surface of the n+ type silicon carbide substrate 100. The ion doping concentration of the n type layer 300 may be higher than the ion doping concentration of the n− type layer 200.

Here, the n− type layer 200 is formed by epitaxial growth at the first surface of the n+ type silicon carbide substrate 100, and the n type layer 300 is formed is formed by epitaxial growth on the n− type layer 200.

The n− type layer 200 is formed by epitaxial growth at the first surface of the n+ type silicon carbide substrate 100, and the n type layer 300 may be formed by injecting the n type ion at the surface of the n− type layer 200.

Figure 6:
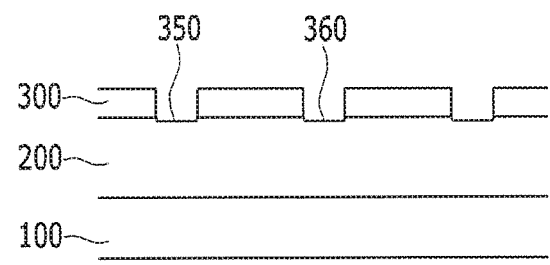

Referring to FIG. 6, the n type layer 300 is etched to form a first trench 350 and a second trench 360. The first trench 350 and the second trench 360 are adjacent to and separated from each other. The depth of the first trench 350 and the second trench 360 may be the same.

Figure 7:
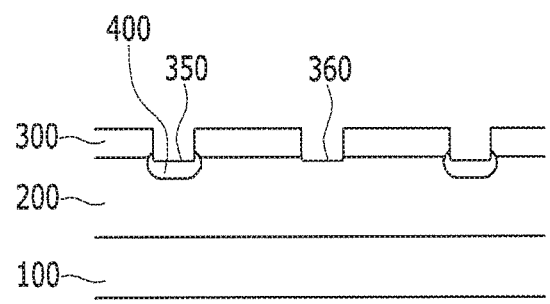

Referring to FIG. 7, the p+ type ion is injected to a lower surface of the first trench 350 to form the p+ type region 400. The p+ type region 400 is formed under the lower surface of the first trench 350, encloses the corner of the lower surface of the first trench 350, and contacts the n− type layer 200.

Figure 8:
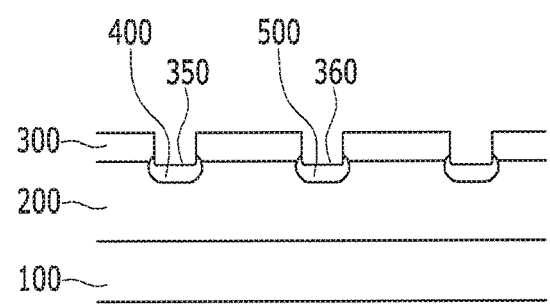

Referring to FIG. 8, the p type ion is injected to the lower surface of the second trench 360 to form the p type region 500. The p type region 500 is formed under the lower surface of the second trench 360, encloses the lower surface of the second trench 360, and contacts the n− type layer 200. Here, the ion doping concentration of the p type region 500 is lower than the ion doping concentration of the p+ type region 400.

Next, as shown in FIG. 1, on the plane, the p type region 500 has the hexagonal shape and is separated from the p+ type region 400, and the n− type layer 200 is positioned between the p type region 500 and the p+ type region 400. The n− type layer 200 positioned between the p type region 500 and the p+ type region 400 has the hexagonal shape. That is, on the plane, the n− type layer 200 of the hexagonal shape encloses the p type region 500 of the hexagonal shape, and the p+ type region 400 is positioned at the remaining portion.

The p type region 500 is in plural and is positioned in the matrix shape. The plurality of p type regions 500 are positioned with the zigzag shape in the column direction such that the horizontal line passing through the center point of the p type region 500 does not meet the horizontal line passing through the p type region 500 positioned to be adjacent to each other in the column direction on the plane.

Referring to FIG. 2, the anode 600 is formed on the n type layer 300, inside the first trench 350, and inside the second trench 360, and the cathode 700 is formed at the second surface of the n+ type silicon carbide substrate 100.

Here, the anode 600 includes a first anode 610 positioned inside the first trench 350 and the second trench 360 and a second anode 620 positioned on the first anode 610 and the n type layer 300. The first anode 610 contacts the p+ type region 400 and the p type region 500.

The anode 600 may include the Schottky metal, and the cathode 700 may include the ohmic metal.

On the other hand, in the manufacturing method of the semiconductor element according to the present exemplary embodiment, the p+ type region 400 and the p type region 500 are formed after simultaneously forming the first trench 350 and the second trench 360, however it is not limited thereto, and the first trench 350 may be firstly formed, and the p+ type region 400 may be formed under the lower surface of the first trench 350 and then the second trench 360 may be formed and the p type region 500 may be formed under the lower surface of the second trench 360.

While this invention has been described in connection with what is presently considered to be practical exemplary embodiments, it is to be understood that the invention is not

What is claimed is:

1. A Schottky barrier diode comprising:
   an n− type layer disposed on a first surface of an n+ type silicon carbide substrate;
   a p+ type region and a plurality of p type regions disposed on the n− type layer;
   an anode disposed on the n− type layer, the p+ type region, and the plurality of p type regions; and
   a cathode disposed on a second surface of the n+ type silicon carbide substrate,
   wherein each of the plurality of p type regions has a hexagonal shape on a plane, and the plurality of p type regions are arranged in a matrix shape on the plane,
   on the plane: the n− type layer comprises a plurality of hexagonal shape portions that are spaced apart from each other and that are disposed between the p+ type region and the plurality of p type regions, the p+ type region is disposed between the plurality of hexagonal shape portions of the n− type layer, and the plurality of hexagonal shape portions of the n− type layer enclose the plurality of p type regions, respectively,
   on the plane: the p+ type region is an entirely continuous region completely surrounding the plurality of hexagonal shape portions,
   the p+ type region and the plurality of p type regions respectively contact the n− type layer, and
   on the plane: an area where the p+ type region and the n− type layer contact each other is wider than an area where the plurality of p type regions and the n− type layer contact each other.

2. The Schottky barrier diode of claim 1, wherein
   a horizontal line, which passes through a center point of each of the plurality of p type regions, does not meet a horizontal line of each of the plurality of p type regions that is adjacent thereto in a column direction on the plane.

3. The Schottky barrier diode of claim 1, wherein
   an ion doping concentration of the p+ type region is higher than an ion doping concentration of the plurality of p type regions.

4. The Schottky barrier diode of claim 3, wherein
   the anode includes a Schottky electrode, and
   the cathode includes an ohmic electrode.

5. The Schottky barrier diode of claim 4, further comprising:
   an n type layer disposed between the anode and the n− type layer, and
   the ion doping concentration of the n type layer is higher than the ion doping concentration of the n− type layer.

6. The Schottky barrier diode of claim 5, further comprising
   a first trench and a second trench disposed on the n type layer, the first trench and the second trench separated from each other.

7. The Schottky barrier diode of claim 6, wherein
   the p+ type region is disposed under a bottom surface of the first trench, and
   each of the plurality of p type regions is disposed under the bottom surface of the second trench.

8. The Schottky barrier diode of claim 7, wherein
   the anode includes:
   a first anode disposed inside the first trench and the second trench, and
   a second anode disposed on the first anode and the n type layer.

9. A Schottky barrier diode comprising:
   an n− type layer disposed on a first surface of an n+ type silicon carbide substrate;
   a single p+ type region disposed on the n− type layer;
   a plurality of p type regions disposed on the n− type layer and dispersed in the single p+ type region;
   an anode disposed on the n− type layer, the single p+ type region, and the plurality of p type regions; and
   a cathode disposed on a second surface of the n+ type silicon carbide substrate,
   wherein each of the plurality of p type regions has a hexagonal shape on a plane, and the plurality of p type regions are arranged in a matrix shape on the plane,
   on the plane: the n− type layer comprises a plurality of hexagonal shape portions that are spaced apart from each other and that are disposed between the single p+ type region and the plurality of p type regions, the single p+ type region is disposed between the plurality of hexagonal shape portions of the n− type layer, and the plurality of hexagonal shape portions of the n− type layer enclose the plurality of p type regions, respectively,
   on the plane: the single p+ type region completely surrounds the plurality of hexagonal shape portions,
   the single p+ type region and the plurality of p type regions respectively contact the n− type layer, and
   on the plane: an area where the single p+ type region and the n− type layer contact each other is wider than an area where the plurality of p type regions and the n− type layer contact each other.

10. The Schottky barrier diode of claim 9, wherein
    a horizontal line, which passes through a center point of each of the plurality of p type regions, does not meet a horizontal line of each of the plurality of p type regions that is adjacent thereto in a column direction on the plane.

* * * * *